(12) United States Patent
Simola et al.

(10) Patent No.: US 9,577,053 B2
(45) Date of Patent: Feb. 21, 2017

(54) ZENER DIODE HAVING AN ADJUSTABLE BREAKDOWN VOLTAGE

(71) Applicant: STMicroelectronics (Rousset) SAS, Rousset (FR)

(72) Inventors: Roberto Simola, Trets (FR); Pascal Fornara, Pourrieres (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 14/963,670

(22) Filed: Dec. 9, 2015

(65) Prior Publication Data
US 2016/0276447 A1  Sep. 22, 2016

(30) Foreign Application Priority Data
Mar. 19, 2015 (FR) ...................... 15 52290

(51) Int. Cl.
| | | |
|---|---|---|
| H01L 29/866 | (2006.01) | |
| H01L 29/40 | (2006.01) | |
| H01L 29/739 | (2006.01) | |
| H01L 29/06 | (2006.01) | |

(52) U.S. Cl.
CPC ......... *H01L 29/402* (2013.01); *H01L 29/0649* (2013.01); *H01L 29/0653* (2013.01); *H01L 29/407* (2013.01); *H01L 29/7391* (2013.01); *H01L 29/866* (2013.01); *H01L 29/0692* (2013.01)

(58) Field of Classification Search
CPC .......................... H01L 29/7391; H01L 29/866
See application file for complete search history.

(56) References Cited

U.S. PATENT DOCUMENTS

| | | | | |
|---|---|---|---|---|
| 8,198,703 | B2 * | 6/2012 | Lin ..................... | H01L 29/0646 257/106 |
| 9,018,673 | B2 * | 4/2015 | Chen .................... | H01L 29/866 257/106 |
| 2013/0082768 | A1 | 4/2013 | Hirler et al. | |
| 2013/0168768 | A1 | 7/2013 | Takada | |

FOREIGN PATENT DOCUMENTS

| | | |
|---|---|---|
| EP | 0 949 683 A1 | 10/1999 |
| JP | 1-232773 A | 9/1989 |
| JP | 3-283470 A | 12/1991 |

\* cited by examiner

*Primary Examiner* — Jeffrey Zweizig
(74) *Attorney, Agent, or Firm* — Seed IP Law Group LLP

(57) ABSTRACT

The present disclosure relates to a Zener diode including a Zener diode junction formed in a semiconductor substrate along a plane parallel to the surface of the substrate, and positioned between a an anode region having a first conductivity type and a cathode region having a second conductivity type, the cathode region extending from the surface of the substrate. A first conducting region is configured to generate a first electric field perpendicular to the plane of the Zener diode junction upon application of a first voltage to the first conducting region, and a second conducting region is configured to generate a second electric field along the plane of the Zener diode junction upon application of a second voltage to the second conducting region.

20 Claims, 7 Drawing Sheets

ZENER DIODE HAVING AN ADJUSTABLE BREAKDOWN VOLTAGE

BACKGROUND

Technical Field

The present disclosure relates to a Zener diode. Zener diodes are commonly used to regulate voltage in a circuit or to supply a stable reference voltage. For this purpose, a Zener diode is reverse-connected in parallel with a voltage source. When the voltage supplied by the voltage source reaches the breakdown voltage of the diode, the latter becomes conducting and then maintains the voltage at this value.

Description of the Related Art

FIG. 1 is a cross-section of a conventional Zener diode formed in a substrate made of a semiconductor material of a first conductivity type, for example P. The Zener diode comprises a well NW having a doping of a second conductivity type, for example N, forming an anode region of the Zener diode. The Zener diode comprises a highly doped cathode region CD of the first P+-conductivity type, formed in the well NW. The region CD is formed on a region ZD having a high doping of the second N+-conductivity type. The regions CD and ZD are isolated from the rest of the well NW by a shallow trench isolation STI. The Zener diode comprises a highly doped anode connection region ED of the second N+-conductivity type formed in the well NW and isolated from the cathode region by the trench STI. Furthermore, the substrate SUB comprises a highly doped region SP of the first P+-conductivity type, forming a bias region of the substrate SUB. The substrate bias region SP is isolated from the regions CD, ZD by the shallow trench isolation STI.

FIG. 2 represents a curve C11 of variation of the current passing through the Zener diode according to the reverse voltage applied between the regions CD and ED. The curve C11 shows the operation of a conventional reverse-biased Zener diode. Between 0 and approximately 2.5V, the current passing through the diode remains low (lower than $10^{-12}$ A). From approximately 2.5V and up to approximately 5.2V, the current passing through the diode increases linearly (according to a logarithmic scale) up to approximately $10^{-8}$ A. This operating zone which results from a so-called "band to band" phenomenon cannot be used to supply a reference voltage or to perform a voltage regulation. Above approximately 5.2V, a breakdown phenomenon appears, the diode becoming highly conducting, by avalanche effect, while reaching a maximum voltage BV called "breakdown voltage" of approximately 5.5V. The diode keeps this voltage constant irrespective of the intensity of the current, provided that the latter remains between approximately $10^{-8}$ A and $10^{-6}$ A. Zener diodes are generally used in this operating zone, to supply a stable reference voltage or to perform a voltage regulation.

One proposal already made consists in producing circuits combining several discrete components to reproduce the operation of a Zener diode with a control input to adjust the breakdown voltage of the Zener diode. Thus, the circuit referenced TL431 works in a similar way to a Zener diode the breakdown voltage of which can be adjusted by a voltage value provided to a control terminal of the circuit. However, this circuit is quite complex and large in size, due to the fact that it comprises several dozen discrete components, including more than ten transistors.

BRIEF SUMMARY

Some embodiments are directed to a Zener diode having an adjustable breakdown voltage. Some embodiments produce this diode in the form of a discrete component in an integrated circuit, by implementing manufacturing steps commonly used to produce CMOS transistors.

Some embodiments relate to a Zener diode comprising: a Zener diode junction formed in a semiconductor substrate parallel to the surface of the substrate between a cathode region and an anode region having a first conductivity type, the cathode region being formed by a region having a second conductivity type on the surface of the substrate, and first conducting regions configured to generate a first electric field perpendicular to the Zener diode junction, when they are subjected to adequate voltages. According to one embodiment, the Zener diode includes second conducting regions configured to generate a second electric field along the plane of the Zener diode junction, when they are subjected to adequate voltages.

According to one embodiment, the second conducting regions include an embedded gate separated from the Zener diode junction only by a dielectric layer.

According to one embodiment, the dielectric layer has a thickness between 15 and 25 nm.

According to one embodiment, the gate isolates the cathode region from an anode connection region.

According to one embodiment, the gate surrounds the Zener diode junction.

According to one embodiment, the gate has an octagonal or rectangular shape.

According to one embodiment, the Zener diode comprises: a well formed in the semiconductor substrate having the second conductivity type, forming the anode region, and an anode connection region of the second conductivity type, formed in the well on the surface of the substrate and isolated from the cathode region.

According to one embodiment, the well is isolated from the substrate by a shallow trench isolation.

According to one embodiment, the Zener diode includes a thin region, of the first conductivity type, disposed between the anode and cathode regions.

Some embodiments may also relate to a circuit comprising a Zener diode as disclosed herein.

Some embodiments may also relate to a method for controlling a Zener diode as disclosed herein, the process comprising: applying a first voltage to the cathode region, applying to the anode region a second voltage to reverse-bias the Zener diode, the difference between the first voltage and the second voltage being greater than or equal to a breakdown voltage of the Zener diode. According to one embodiment, the method includes applying a third voltage to the second conducting regions to generate an electric field along the plane of the Zener diode junction.

According to one embodiment, the third voltage is applied to the second conducting regions through an embedded gate, separated from the Zener diode junction only by a dielectric layer.

According to one embodiment, the control method includes adjusting the third voltage according to a breakdown voltage to be reached by the Zener diode.

According to one embodiment, the breakdown voltage is adjustable between 5 and 13V by causing the third voltage to vary between the first voltage and the second voltage.

BRIEF DESCRIPTION OF THE SEVERAL VIEWS OF THE DRAWINGS

Some examples of embodiments of the present disclosure will be described below in relation with, but not limited to, the appended figures, in which.

DETAILED DESCRIPTION

Figure 1:
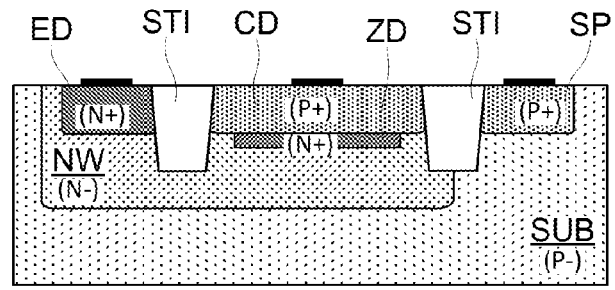
FIG. 1 is a cross-section of a conventional Zener diode.
Figure 2:
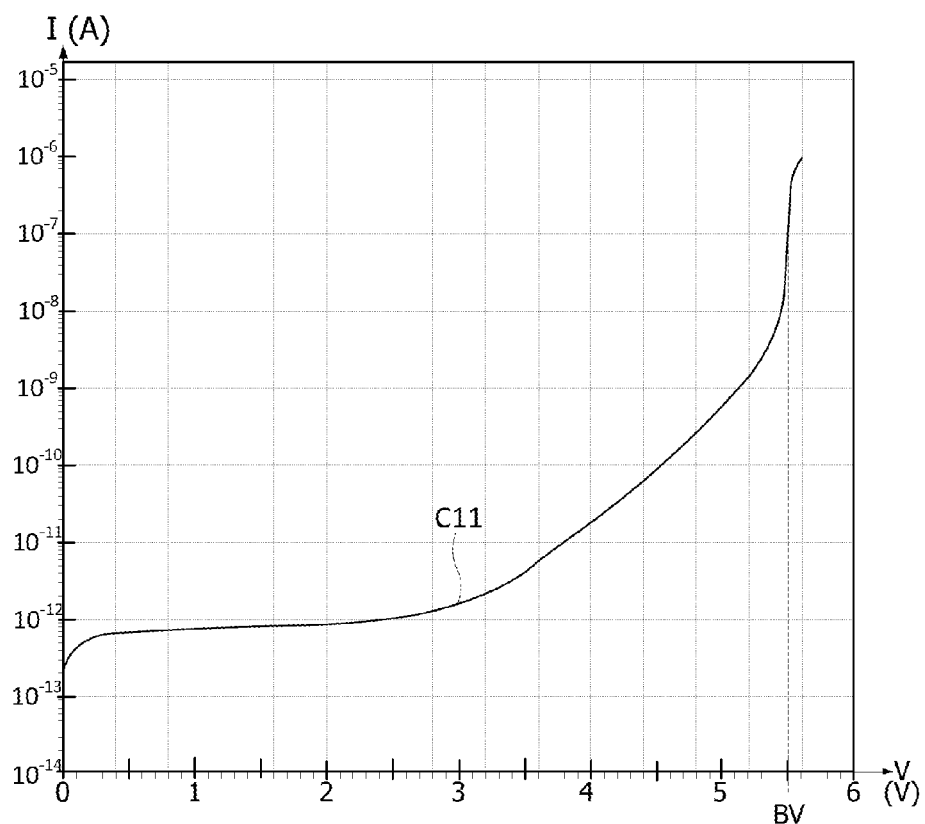
FIG. 2 represents a characteristic curve of current according to the voltage at the terminals of a conventional Zener diode.
Figure 3:
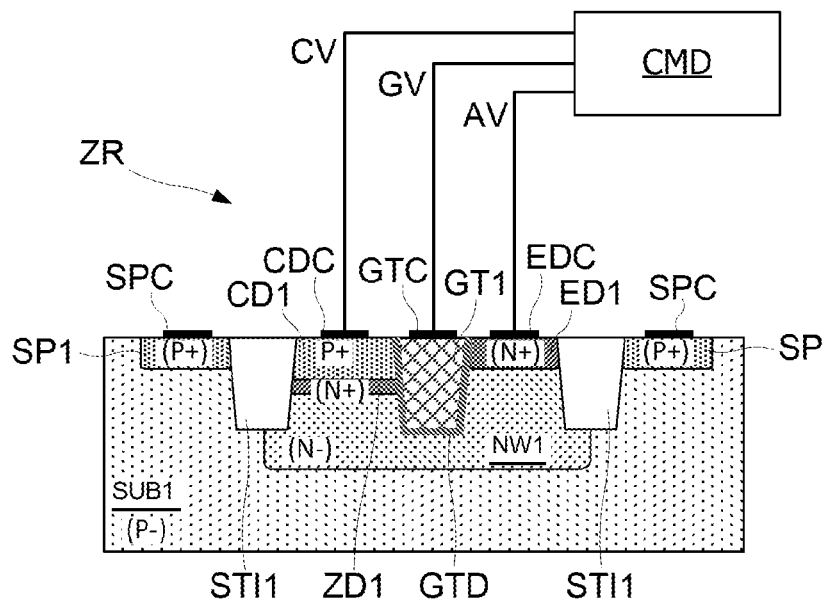
FIG. 3 is a cross-section of a Zener diode according to one embodiment.

FIG. 3 represents a Zener diode ZR according to one embodiment. The Zener diode is formed in a well NW formed in a substrate SUB1 made of a semiconductor material having a doping of a first conductivity type, for example P. The well NW has a doping of a second conductivity type (N). The Zener diode ZR includes a cathode region CD1 having a high doping of the first conductivity type, for example P+, formed in the well NW1 constituting an anode region. The well NW1 is isolated from the rest of the substrate SUB1 by a shallow trench isolation STI1. The Zener diode ZR also includes a highly doped region ED1 of the second conductivity type (N+), forming a bias region of the well NW1 and thus a connection region of the anode of the diode ZR. Furthermore, the substrate SUB1 includes one or more highly doped regions SP1, of the first conductivity type (P+), forming bias regions of the substrate SUB1. The Zener diode ZR also includes a cathode contact pad CDC formed on the region CD1, and an anode contact pad EDC formed on the region ED1. One or more bias contacts SPC of the substrate are formed on the substrate SUB1 bias regions SPP.

According to one embodiment, the Zener diode ZR includes a vertical embedded gate GT1, formed in the well NW1, so as to be separated from the cathode region CD1 and in particular, from the junction zone PN of the diode ZR, between the region CD1 and the anode region formed by the well NW1, only by a gate oxide layer GTD. The gate GT1 is provided to receive a bias voltage GV through a gate contact pad GTC. The voltage GV can be supplied by a circuit CMD also supplying the cathode contact pad CDC with a cathode voltage CV and the anode contact pad EDC with an anode voltage.

To increase the transition slope between the P+- and N-doping forming the junction PN of the Zener diode, and thus obtain a "sudden" junction PN, the region CD1 can be formed on a relatively thin region ZD1, having a high doping of the second N+-conductivity type. However, the region ZD1 remains optional and can be provided if it is desirable to reduce the range of breakdown voltages BV susceptible of being reached by causing the voltage applied to the gate GTC to vary.

The gate GT1 can be produced by etching a hole or a trench in the substrate SUB1, by forming on the walls and the bottom of the trench the dielectric layer GTD, for example by oxidation, and then by filling the trench with a conducting material such as a metal or polycrystalline silicon. These manufacturing steps, and those enabling the different doped regions and the trench STI1 to be formed, are commonly implemented to produce CMOS transistor-based circuits. The dielectric or gate oxide layer GTD may have a thickness between 15 nm and 25 nm, for example in the order of 20 nm to obtain a breakdown voltage greater than 5V.

Figure 4:
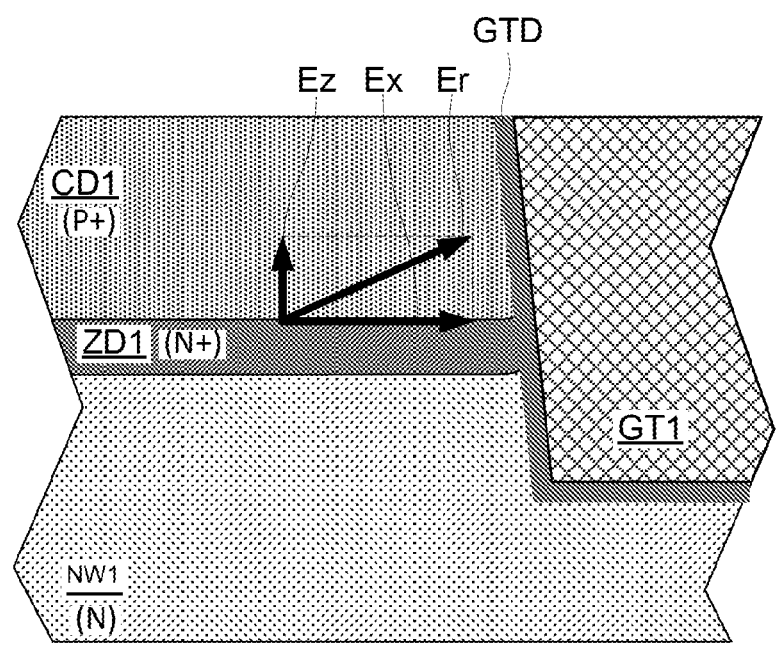
FIG. 4 is a detailed partial cross-section of the Zener diode of FIG. 3.

FIG. 4 represents in greater detail the junction PN of the Zener diode ZR formed between the region CD1 and the well NW1, and in particular, the contact zone between the junction PN and the gate GT1. When the Zener diode ZR is reverse-biased, the cathode contact pad CDC receives a voltage lower than the voltage applied to the well NW1 bias contact pad EDC, for example set to 0V. In these conditions, an electric field Ez directed perpendicularly to the surface of the substrate SUB1, from the well NW1 towards the region CD1, appears in the region of the junction PN of the diode ZR. If the gate GT1 receives a positive voltage, an electric field Ex directed towards the gate GT1 also appears in the plane of the junction PN between the cathode CD1 and anode regions formed in the well NW1. The simultaneous presence of the electric fields Ez and Ex forms a resulting field Er having a direction located in the angular sector between the directions of the fields Ez and Ex. It can be seen that the amplitude of the field Er is higher than that of the field Ez. In addition to this effect of increasing the electric field, there is a proximity effect, as the gate GT1 is directly in contact with the junction PN. The result is that the charges present at the junction PN are subjected to a higher electric field and thus become mobile under the effect of a lower voltage applied to the region CD1, this mobility resulting in a breakdown phenomenon by avalanche effect. Thus, the gate GT1 is used here as an electrically conducting element to bring a voltage into the vicinity of the junction PN of the Zener diode, so as to generate the electric field Ex.

Figure 5:
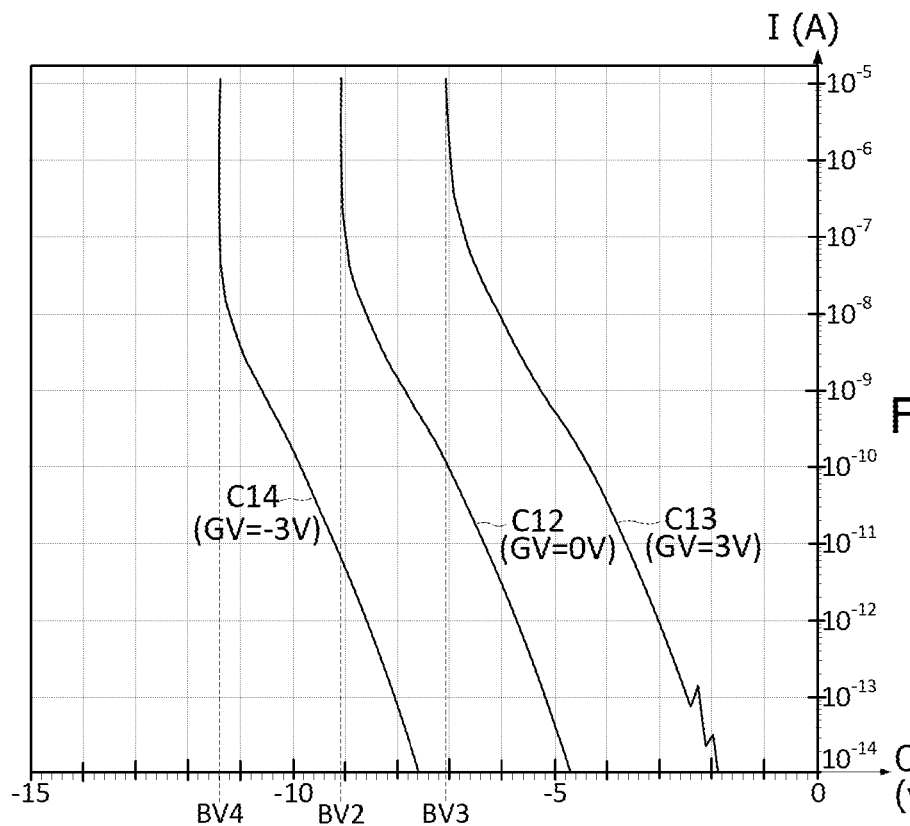
FIG. 5 represents characteristic curves of the current according to the voltage at the terminals of the Zener diode of FIG. 3.

FIG. 5 represents curves C12, C13, C14 of variation of the current passing through the Zener diode ZR according to the voltage CV applied to the cathode region CD1, when the voltage CV varies between 0 and −15V, the voltage AV applied to the anode connection region ED1 being for example set to 0V. The diode ZR is thus reverse-biased. The curve C12 has been obtained by applying to the gate GT1 a voltage GV equal to the anode voltage AV (0V). The curve C13 has been obtained by applying to the gate GT1 a voltage greater than the anode voltage AV (approximately 3V), and the curve C14 has been obtained by applying to the gate GT1 a voltage GV lower than the anode voltage AV (approximately −3V). Between 0 and approximately 8.5V for the curve C12, between 0 and 6.5V for the curve C13, and between 0 and approximately 11V for the curve C14, the current passing through the diode ZR linearly increases according to a logarithmic scale, while remaining very low (lower than $5.10^{-8}$ A). Above these values, a breakdown phenomenon appears, the diode ZR becoming highly conducting at a breakdown voltage BV2 of approximately 9V for the curve C12, a breakdown voltage BV3 of approximately 7V for the curve C13 and a breakdown voltage BV4 of approximately 11.4V for the curve C14. The diode ZR keeps this voltage BV2, BV3, BV4 constant irrespective of the intensity of the current, provided that the latter remains greater than approximately $10^{-6}$ A. The comparison of the curves C12, C13 and C14 shows that the application of a voltage on the gate GT1 enables the breakdown voltage of the diode ZR to be caused to vary.

According to one embodiment, the breakdown voltage of the diode ZR is controlled, for example by the circuit CMD, by adjusting the voltage GV applied to the gate GT1. In this way, the Zener diode ZR can be used to produce an adjustable reference voltage source or a voltage regulator having an adjustable setpoint voltage.

Figure 6:
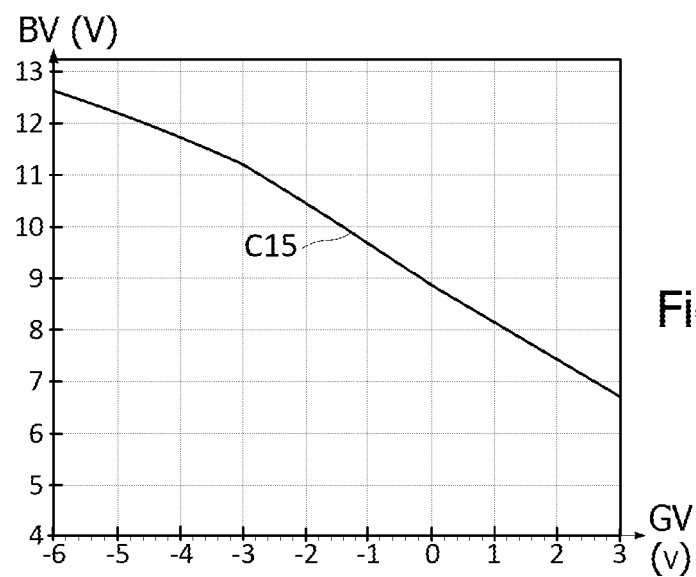
FIG. 6 represents a curve of variation of the breakdown voltage of the Zener diode according to a gate voltage.

FIG. 6 represents a curve C15 of variation of the breakdown voltage BV of the diode ZR according to the voltage GV applied to the gate GT1. The curve C15 shows that the breakdown voltage BV of the diode ZR decreases substantially linearly from approximately 12.7V to 6.7V when the gate voltage GT1 increases from −6V to 3V, the anode voltage AV being set to 0V. It shall be noted that by increasing the gate voltage GT1 again, the breakdown voltage can be decreased to 5V, and that by decreasing the gate voltage, the breakdown voltage can reach 13V.

Figure 7:
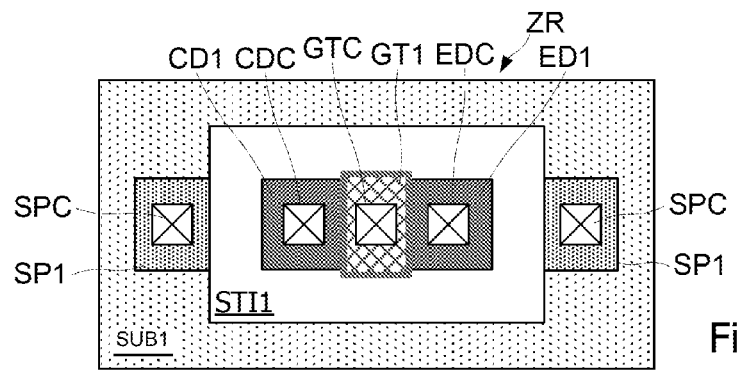
FIG. 7 is a top view of the Zener diode, according to one embodiment.

FIG. 7 is a top view of the Zener diode ZR according to one embodiment. In the embodiment shown in FIG. 7, the gate GT1 isolates the regions CD1, ZD1 from the bias region ED1. The trench STI1 surrounds a zone comprising the regions CD1, ZD1, the gate GT1 and the region ED1. One or more regions SP1 for biasing the substrate SUB1 can be formed around the diode ZR delimited by the trench STI1.

Figure 8:
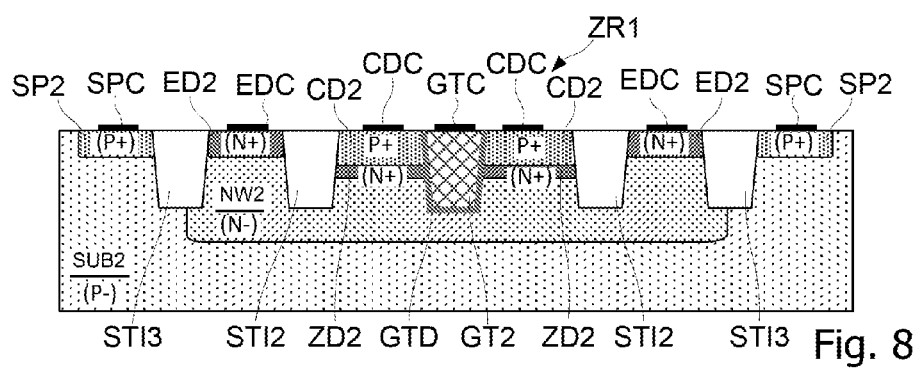
FIGS. 8 and 9 are a cross-section and a top view of a Zener diode, according to another embodiment.
Figure 9:
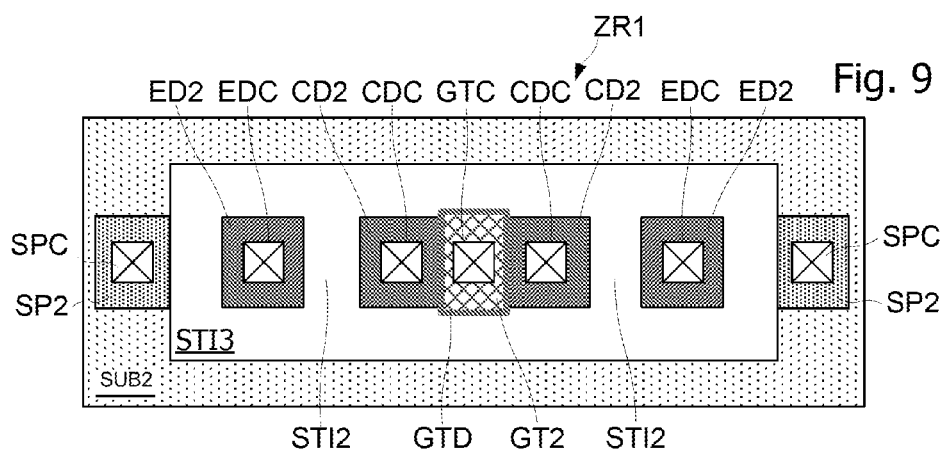

FIGS. 8 and 9 illustrate a cross-section and a top view, respectively, of a Zener diode ZR1 according to another embodiment. The diode ZR1 includes a cathode region CD2 having a high doping of the first conductivity type (P+), superimposed on a region ZD2 having a high doping of the second conductivity type (N+). The regions CD2, ZD2 are formed in a well NW2 having a doping of the second conductivity type (N), which is formed in the substrate SUB2.

According to one embodiment, an embedded gate GT2 is formed in the regions DB2, ZD2, so as to be in contact with the junction PN of the diode ZR1. The regions CD2, ZD2 including the gate GT2, are isolated from the rest of the well NW2 by a shallow trench isolation STI2. The Zener diode ZR1 also includes in the well NW2, a highly doped region ED2 of the second conductivity type (N+), forming a region for biasing the well NW2 and for connecting the anode of the diode ZR1. The well NW2 is isolated from the rest of the substrate SUB2 by a shallow trench isolation STI3. Furthermore, the substrate SUB2 includes one or more highly doped regions SP2, of the first conductivity type (P+), forming bias regions of the substrate SUB2. The Zener diode ZR1 also includes a cathode contact pad CDC formed on the region CD2, an anode contact pad EDC formed on the region ED2, and a gate contact pad GTC formed on the gate GT2. One or more bias contacts SPC are formed on the substrate SUB2 bias regions SP2.

As can be seen from FIG. 9, the trench isolations STI2, STI3 isolate three regions, i.e., a central region and two lateral regions including the anode connection regions ED2, on either side of the central region. The central region includes the gate GT2 and on either side of the gate, the cathode regions CD2.

Figure 10:
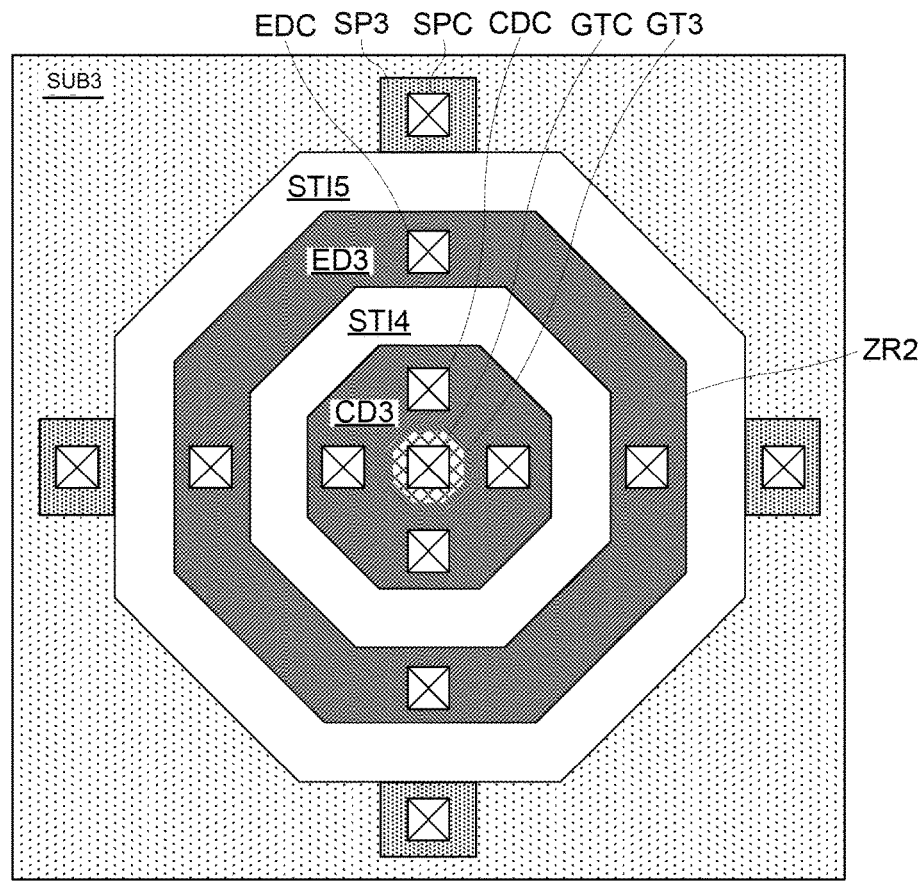
FIG. 10 is a top view of a Zener diode according to another embodiment.

FIG. 10 represents a top view of a Zener diode ZR2 having a cross-section configuration which can be similar to that of FIG. 8, according to another embodiment. The diode ZR2 includes a cathode region CD3 superimposed on an anode region, surrounding an embedded gate GT3, the cathode region CD3 being surrounded by a trench isolation STI4. The diode ZR2 also includes an anode connection region ED3 surrounding the trench isolation STI4 and which is isolated from the substrate SUB3 by a trench isolation STI5. The cathode CD3 and anode connection ED3 regions, and the trenches STI4, STI5 have an octagonal shape. The gate GT3 may have a square shape or more generally a rectangular, or even octagonal, shape.

Figure 11:
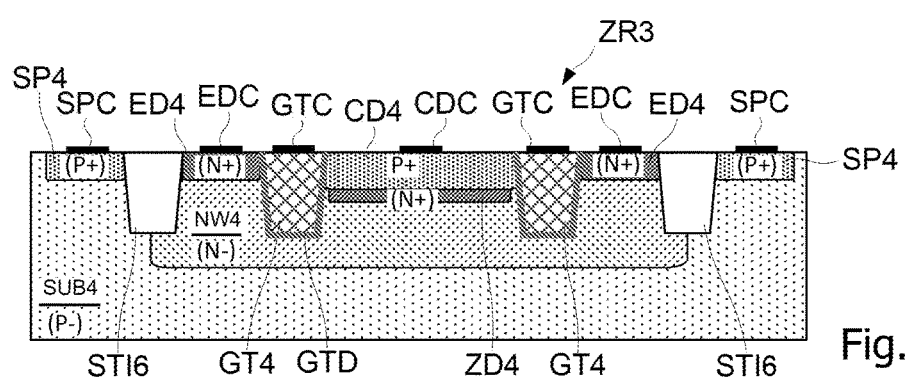
FIGS. 11 and 12 are a cross-section and a top view of a Zener diode, according to another embodiment.
Figure 12:
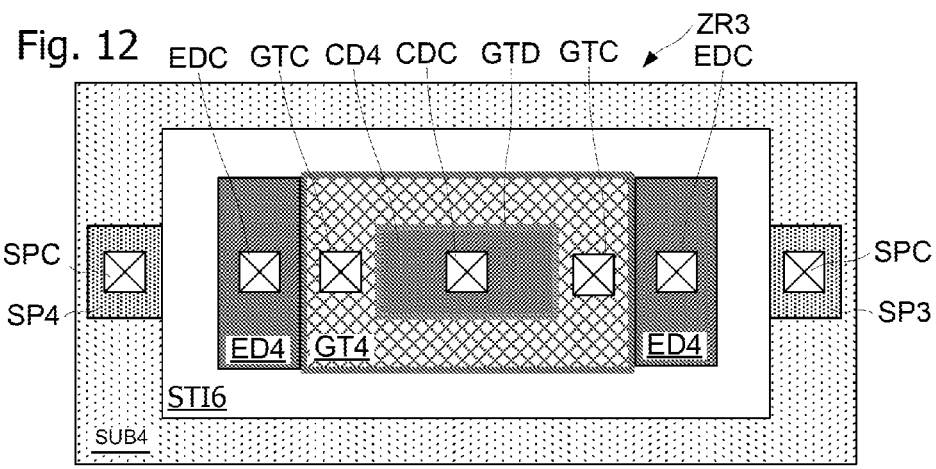

FIGS. 11 and 12 represent a cross-section and top view, respectively, of a Zener diode ZR3 including a cathode region CD4 having a high doping of the first conductivity type (P+), superimposed on a region ZD4 having a high doping of the second conductivity type (N+). The regions CD4, ZD4 are formed in the well NW4 and isolated from the rest of the well NW4 by an embedded gate GT4 formed in a trench surrounding the regions CD4, ZD4. Anode connection regions ED4 are formed in the well NW4 along external edges of the gate GT4. The well NW4 is isolated from the substrate SUB4 by a trench isolation STI6 surrounding the gate GT4 and the anode connection regions ED4.

Figure 13:
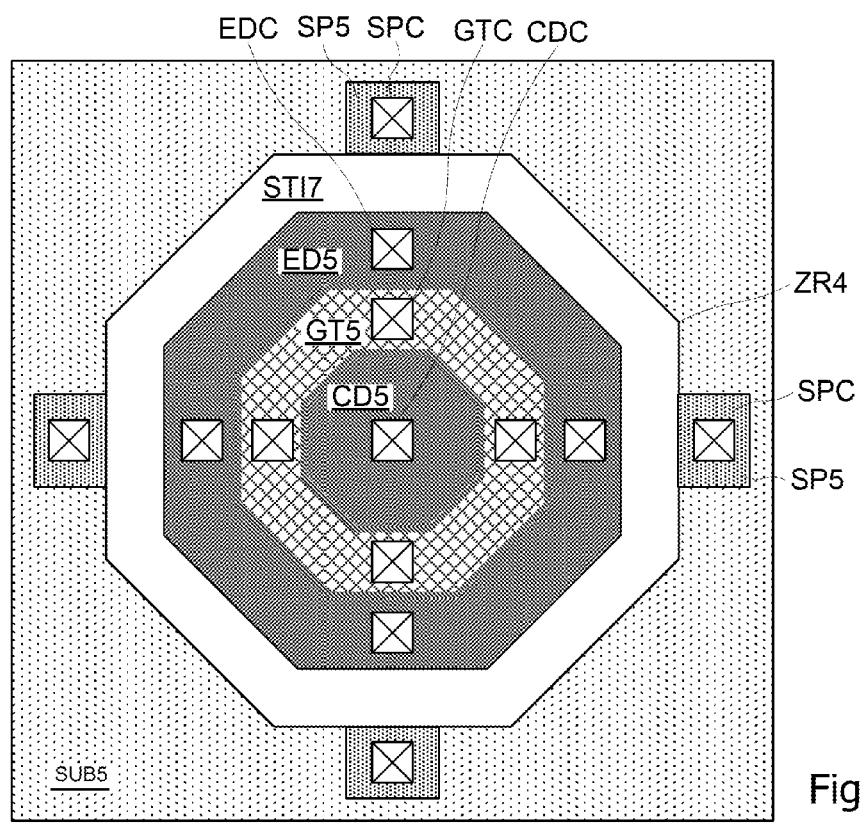
FIG. 13 is a top view of a Zener diode, according to another embodiment.

FIG. 13 represents a top view of a Zener diode ZR4 having a cross-section configuration which can be similar to that of FIG. 11, according to another embodiment. The diode ZR4 includes a cathode region CD5 superimposed on an anode region, and surrounded by an embedded gate GT5, the gate GT5 being surrounded by an anode connection region ED5. The diode ZR4 also includes a shallow trench isolation STI7 isolating the anode connection region ED5 and the well (e.g., the well NW4 shown in FIG. 11) from the substrate SUBS. The cathode CD5 and anode connection ED5 regions, and the gate GT5 and the trenches STI7 have an octagonal shape.

It will be understood by those skilled in the art that the present disclosure is susceptible of various alternative embodiments and various applications. In particular, the disclosure is not limited to the shapes of the different regions of the Zener diodes presented. For example, the regions ZD2 (shown in FIG. 8) and ZD4 (shown in FIG. 11) can be omitted, mainly if it is not desirable to reduce the range of breakdown voltages susceptible of being reached by causing the voltage applied to the gate GT2, GT3, GT4, GT5 to vary. Shapes other than the rectangular and octagonal shapes described can be considered for the different regions of the Zener diode. Thus, circular and square shapes and other polygonal shapes can be considered for these regions.

Figure 14:
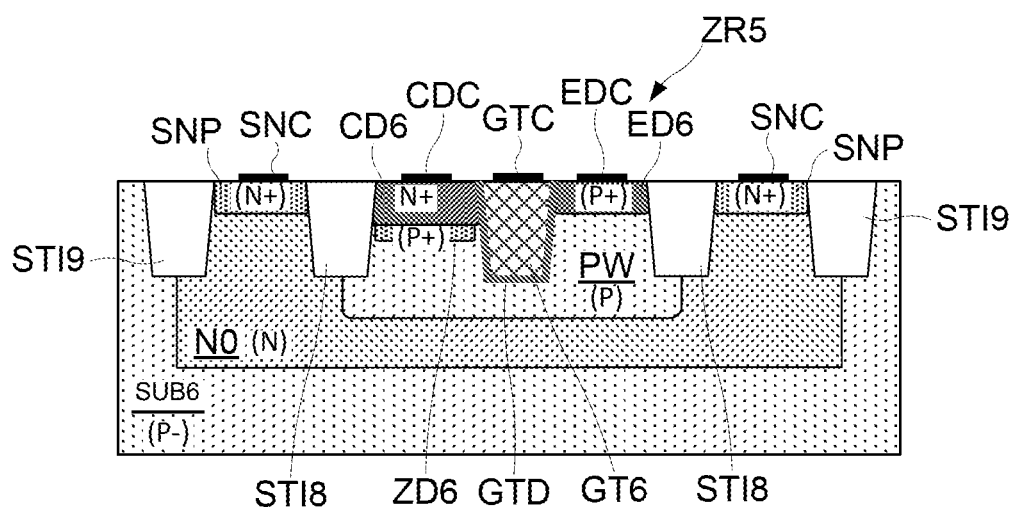
FIG. 14 is a cross-section of a Zener diode, according to one embodiment.

Furthermore, in all the embodiments described above, the conductivity types of the doping of the different regions forming the Zener diode can be inverted. Thus, FIG. 14 represents a Zener diode ZR5 having the shape of the diode ZR (shown in FIG. 3), formed in a well PW having a doping of the first conductivity type (P), the well PW being formed in a well N0 formed by deeply implanting dopants of the second conductivity type (N) in the substrate SUB6. As above, the well PW is isolated from the well N0 by a trench isolation STI8. The well N0 may be isolated from the substrate SUB6 by shallow trench isolations STI9. The diode ZR5 includes a vertical gate GT6 embedded in the well PW. In the example of FIG. 14, the gate GT6 delimits on one side with the trench isolation STI8 a highly doped cathode region CD6 of the second conductivity type (N+), superimposed on a highly doped region ZD6 of the first conductivity type (P+). The gate GT6 delimits on another side with the trench isolation STI8 a highly doped anode connection region ED6 of the first conductivity type (P+). The regions CD6 and ED6 are topped by respective contact pads CDC and EDC. The well N0 is biased (grounded) through highly doped bias regions SNC of the second conductivity type (N+), each topped by a bias contact pad SNC. It shall be noted that the Zener diode ZR5 is reverse-biased by applying to the cathode contact pad CDC a voltage higher than the voltage applied to the contact pad EDC for biasing the well PW. Here again, the region ZD6 can be omitted for the same reasons as previously mentioned.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A Zener diode comprising:
   a Zener diode junction formed in a semiconductor substrate along a plane parallel to a surface of the substrate, and positioned between an anode region having a first conductivity type and a cathode region having a second conductivity type, the cathode region extending from the surface of the substrate;
   a first conducting region configured to generate a first electric field perpendicular to the plane of the Zener diode junction upon application of a first voltage to the first conducting region; and
   a second conducting region configured to generate a second electric field along the plane of the Zener diode junction upon application of a second voltage to the second conducting region.

2. The Zener diode according to claim 1, comprising a dielectric layer, wherein the second conducting region includes an embedded gate separated from the Zener diode junction only by the dielectric layer.

3. The Zener diode according to claim 2, wherein the dielectric layer has a thickness between 15 and 25 nm.

4. The Zener diode according to claim 2, comprising an anode connection region, wherein the gate isolates the cathode region from the anode connection region.

5. The Zener diode according to claim 2, wherein the gate surrounds the Zener diode junction.

6. The Zener diode according to claim 2, wherein the gate has an octagonal or rectangular shape.

7. The Zener diode according to claim 1, comprising:
   a well formed in the semiconductor substrate having the second conductivity type, the well forming the anode region; and
   an anode connection region of the second conductivity type, formed in the well at the surface of the substrate and isolated from the cathode region.

8. The Zener diode according to claim 7, comprising a shallow trench isolation, wherein the well is isolated from the substrate by the shallow trench isolation.

9. The Zener diode according to claim 1, comprising a thin region, of the first conductivity type, positioned between the anode and cathode regions, the thin region having a higher doping level than the anode region.

10. A circuit comprising:
    a Zener diode, the Zener diode including:
      a Zener diode junction formed in a semiconductor substrate along a plane parallel to a surface of the substrate, and positioned between an anode region having a first conductivity type and a cathode region having a second conductivity type, the cathode region extending from the surface of the substrate;
      a first conducting region configured to generate a first electric field perpendicular to the plane of the Zener diode junction upon application of a first voltage to the first conducting region; and
      a second conducting region configured to generate a second electric field along the plane of the Zener diode junction upon application of a second voltage to the second conducting region; and
    circuitry configured to supply the first voltage to the first conducting region and the second voltage to the second conducting region.

11. The circuit according to claim 10, the Zener diode comprising a dielectric layer, wherein the second conducting region includes an embedded gate separated from the Zener diode junction only by the dielectric layer, the embedded gate being configured to isolate the cathode region from an anode connection region.

12. The circuit according to claim 11, wherein the dielectric layer has a thickness between 15 and 25 nm.

13. The circuit according to claim 11, wherein the gate surrounds the Zener diode junction.

14. The circuit according to claim 10, the Zener diode including:
    a well formed in the semiconductor substrate having the second conductivity type, the well forming the anode region; and
    an anode connection region of the second conductivity type, formed in the well on the surface of the substrate and isolated from the cathode region.

15. The circuit according to claim 14, the Zener diode comprising a shallow trench isolation, wherein the well is isolated from the substrate by the shallow trench isolation.

16. The circuit according to claim 10, the Zener diode including a thin region of the first conductivity type positioned between the anode and cathode regions, the thin region having a higher doping level than the anode region.

17. A method for controlling a Zener diode, comprising:
    applying a first voltage to a cathode region of the Zener diode, the cathode region extending from the surface of the substrate;
    applying to an anode region of the Zener diode a second voltage to reverse-bias the Zener diode, the anode region having a first conductivity type, the cathode region having a second conductivity type, the anode and cathode regions forming a Zener diode junction in a semiconductor substrate along a plane parallel to a surface of the substrate, and a difference between the first voltage and the second voltage being equal to or greater than a breakdown voltage of the Zener diode; and
    applying a third voltage to a conducting region of the Zener diode to generate an electric field along the plane of the Zener diode junction.

18. The method according to claim 17, wherein the third voltage is applied to the conducting region through an embedded gate, separated from the Zener diode junction only by a dielectric layer.

19. The method according to claim 17, including:
    adjusting the third voltage according to a breakdown voltage to be reached by the Zener diode.

20. The method according to claim 17, wherein the breakdown voltage is adjustable between 5 and 13V by causing the third voltage to vary between the first voltage and the second voltage.

* * * * *